United States Patent
Kundalgurki et al.

(10) Patent No.: US 9,663,356 B2
(45) Date of Patent: May 30, 2017

(54) ETCH RELEASE RESIDUE REMOVAL USING ANHYDROUS SOLUTION

(71) Applicant: FREESCALE SEMICONDUCTOR, INC., Austin, TX (US)

(72) Inventors: Srivatsa G. Kundalgurki, Austin, TX (US); Ruben B. Montez, Cedar Park, TX (US); Gary Pfeffer, Austin, TX (US)

(73) Assignee: NXP USA, Inc., Austin, TX (US)

( * ) Notice: Subject to any disclaimer, the term of this patent is extended or adjusted under 35 U.S.C. 154(b) by 234 days.

(21) Appl. No.: 14/307,877

(22) Filed: Jun. 18, 2014

(65) Prior Publication Data

US 2015/0368099 A1 Dec. 24, 2015

(51) Int. Cl.
*B81C 1/00* (2006.01)

(52) U.S. Cl.
CPC ........ *B81C 1/00849* (2013.01); *B81C 1/0092* (2013.01); *B81C 1/00134* (2013.01); *B81C 1/00952* (2013.01); *B81C 2201/0109* (2013.01); *B81C 2201/0132* (2013.01)

(58) Field of Classification Search
CPC ............ B81C 1/00134; B81C 1/00857; B81C 1/00912; B81C 1/0092; B81C 1/00936; B81C 1/00952; B81C 1/00841; B81C 1/00849; B81C 2201/0132
See application file for complete search history.

(56) References Cited

U.S. PATENT DOCUMENTS

| | | | |
|---|---|---|---|
| 5,824,601 A * | 10/1998 | Dao | C09K 13/08 216/103 |
| 6,666,979 B2 * | 12/2003 | Chinn | B81B 3/0005 134/3 |
| 7,205,164 B1 * | 4/2007 | Geha | B82Y 10/00 257/E21.665 |
| 7,365,016 B2 * | 4/2008 | Ouellet | B81C 1/00476 216/73 |
| 7,517,809 B2 | 4/2009 | Korzenski et al. | |
| 8,071,486 B2 | 12/2011 | Fortin et al. | |
| 2012/0107993 A1 * | 5/2012 | Karlin | B81C 1/00801 438/50 |

FOREIGN PATENT DOCUMENTS

EP 1745864 A3 4/2007

* cited by examiner

*Primary Examiner* — Michael Trinh
(74) *Attorney, Agent, or Firm* — Charlene R. Jacobsen

(57) ABSTRACT

A method of making a microelectromechanical systems (MEMS) device includes etching away a sacrificial material layer to release a mechanical element of the MEMS device. The MEMS device is formed at least partially on the sacrificial material layer, and the etching leaves a residue in proximity to the mechanical element. The residue is exposed to an anhydrous solution to remove the residue. The residue may be an ammonium fluorosilicate-based residue, and the anhydrous solution may include acetic acid, isopropyl alcohol, acetone, or any anhydrous solution that can effectively dissolve the ammonium fluorosilicate-based residue.

17 Claims, 4 Drawing Sheets

ETCH RELEASE RESIDUE REMOVAL USING ANHYDROUS SOLUTION

TECHNICAL FIELD OF THE INVENTION

The present invention relates generally to microelectromechanical systems (MEMS) device fabrication. More specifically, the present invention relates to the removal of residues remaining following vapor phase etching (VPE).

BACKGROUND OF THE INVENTION

The manufacture of microelectromechanical systems (MEMS) devices typically entails the deposition, patterning and etching of various structural and sacrificial material layers to produce, for example, very sensitive movable mechanical parts. By way of example, the sensitive moving mechanical parts are typically made in a silicon structural layer (e.g., polysilicon or silicon-germanium), the sacrificial material underlying these mechanical parts is typically silicon dioxide, and the etch-stop layer underlying this silicon dioxide sacrificial layer is typically silicon nitride and/or another silicon structural layer (e.g., polysilicon or silicon-germanium).

A chemical etching technique, typically referred to as vapor phase etching (VPE), has the ability to etch with relatively fine resolution and high aspect ratio. Thus, VPE can be suitable for the removal of the sacrificial material underlying the mechanical parts formed in a structural layer. Removal of the sacrificial material enables release of the mechanical parts, thereby making them movable in accordance with a particular design. A VPE process involves a chemical reaction between etchant gases to attack the silicon-based sacrificial material. That is, the material to be etched is dissolved at its surface in a chemical reaction with the gas molecules. One common vapor phase etching technology is silicon dioxide etching using vapor hydrogen fluoride (HF).

Unfortunately, vapor HF can attack the silicon nitride underlying the sacrificial material layer, producing an undesirable fluorinated silicon nitride compound. This fluorinated compound remains as a residue on the exposed surfaces of the released structure. Additionally, this fluorinated compound is unstable in moist air and can undergo volumetric expansion in the presence of water. Volumetric expansion of the residue can push against the moving mechanical elements and can damage them. Additionally, or alternatively, a violent reaction can occur when water is introduced to the fluorinated compound that displaces the moving mechanical elements away from the reaction further damaging the moving mechanical elements. And still further, this fluorinated compound residue can become contaminated during VPE processing with metal (for example, aluminum and/or copper) released from collateral etching of exposed metallization layers. This metal contaminated residue can be difficult to remove and can negatively affect device performance.

Accordingly, what is needed is methodology for effectively removing the fluorinated compound to improve MEMS device yield and reliability.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

A method of fabricating microelectromechanical systems (MEMS) devices is provided. The methodology entails the implementation of an anhydrous solution to reliably remove vapor phase etching (VPE) residue without introducing collateral damage to the released structures. Such methodology can significantly increase MEMS device yield and reliability, with reduced risk of sprung die and broken spring structures. Furthermore, the anhydrous solution can reliably remove metal contaminated VPE residue from the metal bond pads to increase wire bond reliability between the bond pads and bonding wires.

Figure 1:
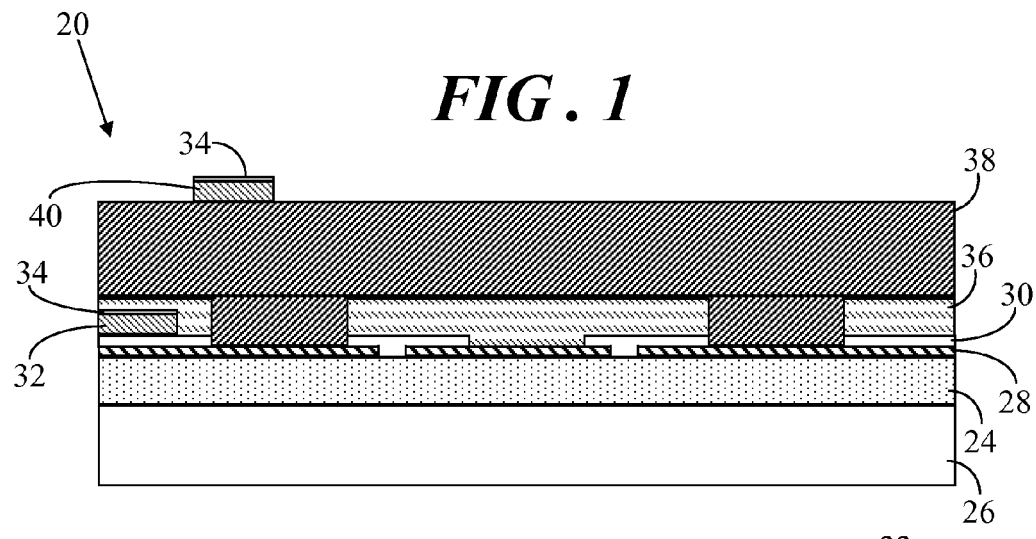
FIG. 1 shows a cross-sectional side view of a microelectromechanical systems (MEMS) device at a relatively early stage of fabrication.

FIG. 1 shows a cross-sectional side view of a microelectromechanical systems (MEMS) device 20 during a relatively early stage 22 of fabrication. At stage 22, MEMS device 20 may have been fabricated utilizing, for example, a surface micromachining process. The following discussion entails the fabrication of a single MEMS device 20. Those skilled in the art will recognize that a multiplicity of MEMS devices 20 may be fabricated concurrently using wafer fabrication techniques.

Surface micromachining builds microstructures by deposition and etching of different structural layers on top of a substrate. In this example, a field oxide 24 is formed on a silicon wafer 26 or other substrate. A first structural layer 28 may be formed on field oxide 24 and selectively etched to yield particular design features. Polysilicon or silicon-germanium is commonly used as first structural layer 28, although embodiments of the invention are not limited by the particular material used to form first structural layer 28.

At least a portion of first structural layer 28 may be protected by a silicon nitride layer 30, which is itself selectively etched in accordance with known methodologies. In some configurations, metallization features 32, such as conductive traces, bond pads, interconnects, and the like, may be formed on silicon nitride layer 30. In some embodiments, metallization features 32 may be formed from tungsten, titanium nitride, or another suitable material having a high melting point. However, embodiments of the invention are not limited by the particular material used to form metallization features 32 on silicon nitride layer 30. Metallization features 32 may be masked with, for example, titanium nitride, or any other suitable mask 34 to protect metallization features 32 during fabrication processes. One or more sacrificial layers 36 may be deposited over any exposed regions of field oxide 24, first structural layer 28, silicon nitride layer 30, and metallization features 32. Silicon dioxide is commonly used as a sacrificial material. However, another suitable material may be used.

Sacrificial layer 36 may be etched to create contact openings in the thickness direction of MEMS device 20. Additional layers can entail a second structural layer 38 (e.g., polysilicon) overlying sacrificial layer 36 and filling any contact openings in sacrificial layer 36, metallization features 40, such as bond pads (one shown), formed on second structural layer 38, and so forth.

Only two structural layers 28, 38 are shown for simplicity of illustration. It should be apparent to those skilled that surface micromachining can involve as many layers as is needed with a different mask (producing a different pattern) on each layer. Additionally, metallization features 32 (formed on silicon nitride layer 30) and metallization features 40 (formed on second structural layer 38) are shown for exemplary purposes. Those skilled in the art will recognize that a MEMS device may include metallization features such as conductive traces, bond pads, interconnects, and the like at both locations, only on silicon nitride layer 30, or only on second structural layer 38 in accordance with a particular design configuration.

Figure 2:
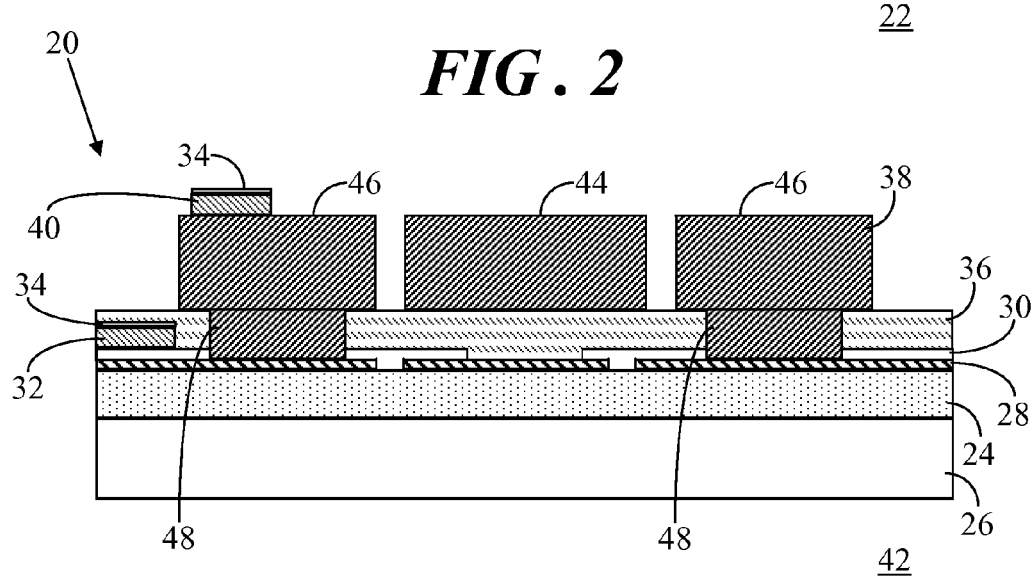
FIG. 2 shows a cross-sectional side view of the MEMS device of FIG. 1 at a subsequent stage of fabrication.

FIG. 2 shows a cross-sectional side view of MEMS device 20 from FIG. 1 at a subsequent stage 42 of fabrication. As shown in FIG. 2, second structural layer 38 has been processed using photolithography and either a wet etch or dry etch process to form the mechanical elements of MEMS device 20. In this example, MEMS device 20 includes a movable part 44 (that is not yet released from the underlying sacrificial layer 36) and stops 46 that may be coupled to the underlying first structural layer 28 via anchors 48. Although not shown herein, a spring system may be interconnected between movable part 44 and stops 46. Once sacrificial layer 36 is removed to release movable part 44, movable part 44 will be capable of movement relative to stops 46 via a spring system (not shown) in accordance with a particular design.

Figure 3:
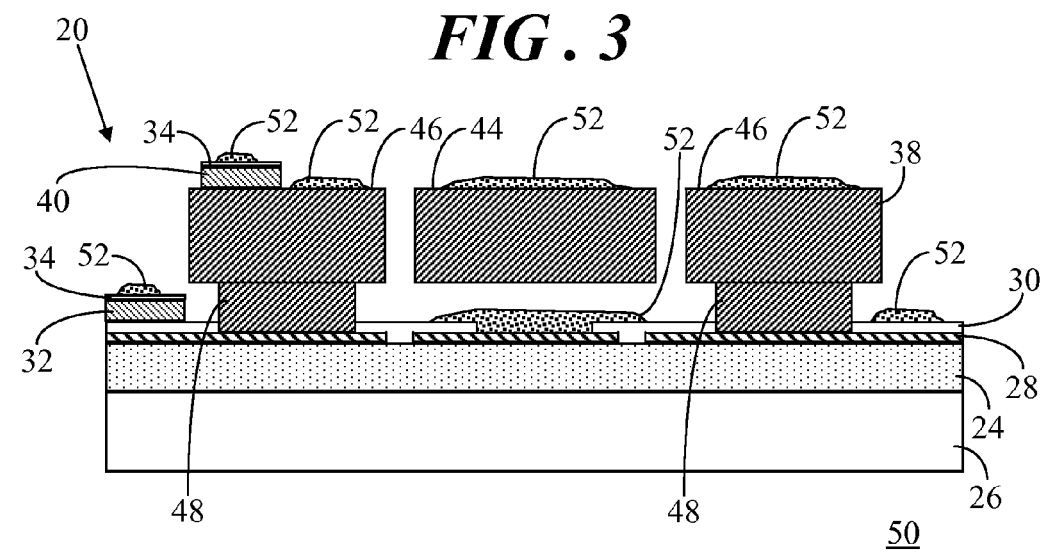
FIG. 3 shows a cross-sectional side view of the MEMS device from FIG. 2 at a subsequent stage of fabrication using a conventional process.

FIG. 3 shows a cross-sectional side view of MEMS device 20 from FIG. 2 at a subsequent stage 50 of fabrication. As shown in FIG. 3, sacrificial layer 36 has been removed to release movable part 44. Sacrificial layer 36 may be removed utilizing a vapor phase etching (VPE) process. VPE may be performed using vapor hydrogen fluoride (HF) to remove the silicon dioxide sacrificial layer 36 underlying movable part 44.

The oxide etch reactions during VPE of silicon dioxide sacrificial layer 36 can be characterized as follows:

$$HF+F^-+H^++H_2O \rightarrow H_3O^++HF_2^- \quad (1)$$

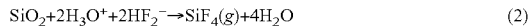
$$SiO_2+2H_3O^++2HF_2^- \rightarrow SiF_4(g)+4H_2O \quad (2)$$

where HF is hydrogen fluoride, F is fluorine, $H_2O$ is water, $H_3O$ is hydronium, $HF_2^-$ is bifluoride, $SiO_2$ is the silicon dioxide sacrificial layer 36, and $SiF_4$ is silicon tetra fluoride (tetrafluorosilane).

Silicon nitride layer 30 underlying movable part 44 and protecting first structural layer 28 also reacts during VPE. The nitride etch reactions during VPE can be characterized as follows:

$$Si_3N_4+9H_2O \rightarrow 3H_2SiO_3+4NH_3 \quad (3)$$

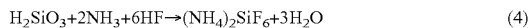
$$H_2SiO_3+2NH_3+6HF \rightarrow (NH_4)_2SiF_6+3H_2O \quad (4)$$

where $Si_3N_4$ is silicon nitride layer 30, $H_2SiO_3$ is silicic acid, $NH_3$ is ammonia, and $(NH_4)_2SiF_6$ is ammonium fluorosilicate. Thus, a chemical compound containing nitrogen, hydrogen, silicon, and fluorine is generated. More particularly, this chemical compound can be ammonium fluorosilicate. The ammonium fluorosilicate can remain as an ammonium fluorosilicate based residue 52 on movable part 44, on stops 46, underneath movable part 44, and on virtually any other exposed surface. Furthermore, areas with more field nitride, e.g., silicon nitride layer 30, may have more residue 52 than areas with less (or no) field nitride.

In addition, ammonium fluorosilicate based residue 52 may become contaminated during VPE processing with metal such as aluminum, copper, and the like that can be released from collateral etching of the exposed metallization features (e.g., the side walls of metallization features 32, 40 that are not protected by mask 34) during VPE. By way of example, aluminum from the side walls of metallization features 40 undergoes collateral etching during VPE and is released in the vapor phase along with the silicon nitride and oxide etch byproducts. Once the processing is complete, the remaining residue 52 can be an aluminum contaminated ammonium fluorosilicate complex which can remain on metallization features 32, 40. Aluminum contamination of ammonium fluorosilicate may be characterized as follows:

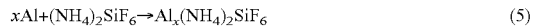
$$xAl+(NH_4)_2SiF_6 \rightarrow Al_x(NH_4)_2SiF_6 \quad (5)$$

Figure 4:
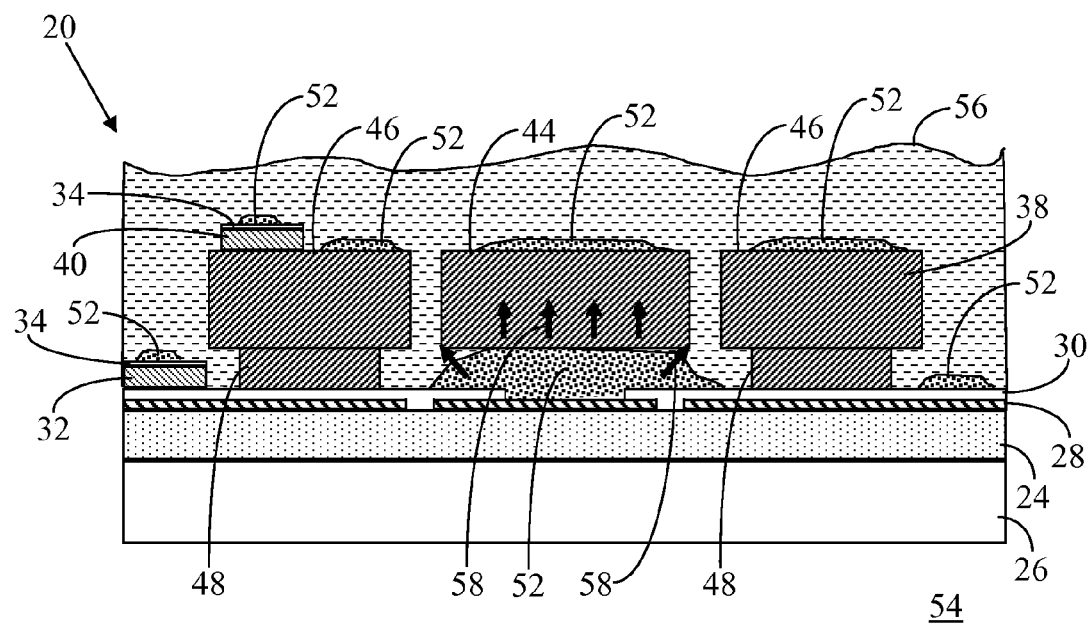
FIG. 4 shows a cross-sectional side view of the MEMS device from FIG. 3 at a subsequent stage of fabrication.

FIG. 4 shows a cross-sectional side view of MEMS device 20 from FIG. 3 at a subsequent stage 54 of fabrication using a conventional process. Some processing techniques call for rinsing the released MEMS structures in an aqueous (i.e., water-based) solution 56 to remove residue 52 and/or mask 34. This aqueous solution 56 may be, for example, hydrogen peroxide ($H_2O_2$). Ammonium fluorosilicate based residue 52 is a hygroscopic chemical compound. A hygroscopic chemical compound is one that is capable of attracting and holding water molecules from the surrounding environment, either through absorption or adsorption. A hygroscopic chemical compound can become physically changed when it absorbs or adsorbs water, such as by increasing in volume, stickiness, or some other physical characteristic. For example, residue 52 can undergo volumetric expansion when it is exposed to aqueous solution 56. Volumetric expansion of residue 52 underlying movable part 44 generates a vertical force 58 (represented by arrows) on movable part 44.

Figure 5:
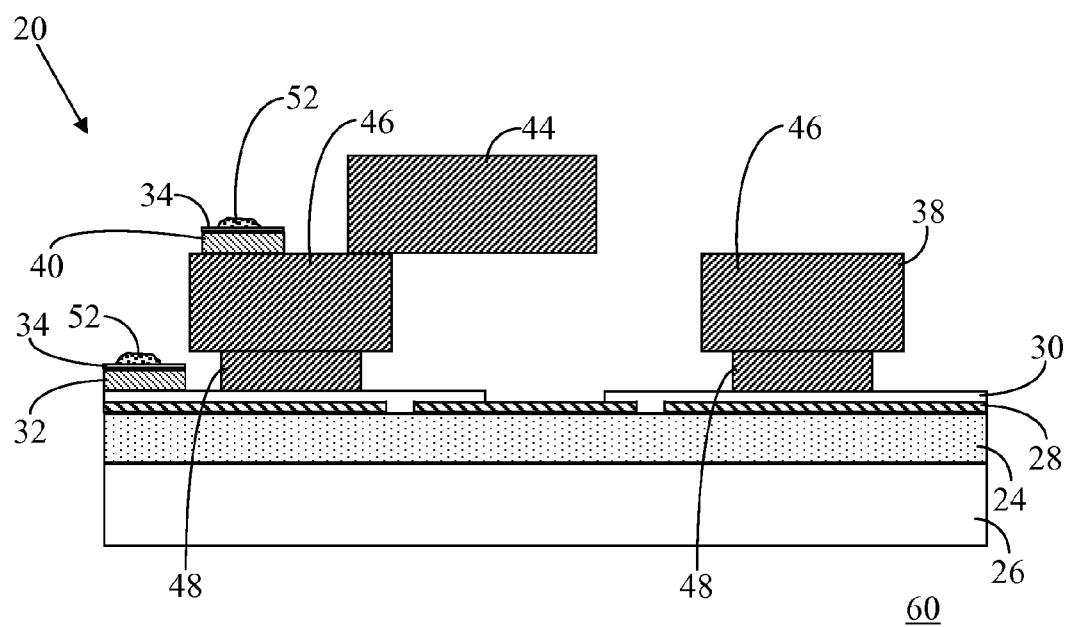
FIG. 5 shows a cross-sectional side view of the MEMS device from FIG. 4 at a subsequent stage of fabrication.

Referring to FIG. 5 in combination with FIG. 4, FIG. 5 shows a cross-sectional side view of MEMS device 20 from FIG. 4 at a subsequent stage 60 of fabrication. Vertical force 58 can be sufficient to cause movable part 44 to travel upwardly and then laterally. The induced z-direction and lateral movement can result in movable part 44 getting "hung up" on stops 46 or other nearby fixed structures of MEMS device 20 as shown in FIG. 5. This condition is sometimes referred to as a "sprung die." Accordingly, after residue 52 is dissolved by aqueous solution 56, the collateral sprung die damage remains. A sprung die and resultant cracked spring features are failure modes that reduce the overall device yield during processing.

It should be observed in FIG. 5 that some ammonium fluorosilicate residue 52 may remain on metallization features 32, 40 following a rinse in aqueous solution 56. As mentioned above, ammonium fluorosilicate residue 52 that is contaminated with a metal, such as aluminum, can remain on metallization features 32, 40. This metal contaminated ammonium fluorosilicate residue 52 is difficult to remove and may not be fully removed by aqueous solution 56. Unfortunately, device performance can be negatively affected if residue 52 is not completely removed from metallization features 32, 40. For example, fluorine left on aluminum metallization features 32, 40 can introduce a corrosive element to the surfaces of metallization features 32, 40. This remaining residue 52 inhibits a strong metallurgical bond between metallization features 32, 40 and bonding wires, hence negatively impacting wire bond reliability.

FIGS. 4 and 5 are provided to demonstrate prior art methodology that can adversely affect device yield during processing. In particular, ammonium fluorosilicate residue may form under movable parts during VPE, and expansion of the residue during a rinse in an aqueous solution can result in sprung die and resultant cracked spring features. Additionally, the ammonium fluorosilicate residue can become contaminated with metal from collateral etching of the metallization layer(s). This metal contaminated ammonium fluorosilicate, which can form on the metallization layers such as the bond bond pads, is difficult to remove, and can negatively impact wire bond reliability and, therefore, device performance. A method is described below that effectively removes this ammonium fluorosilicate residue and the metal contaminated ammonium fluorosilicate residue to increase device yield and reliability.

Figure 6:
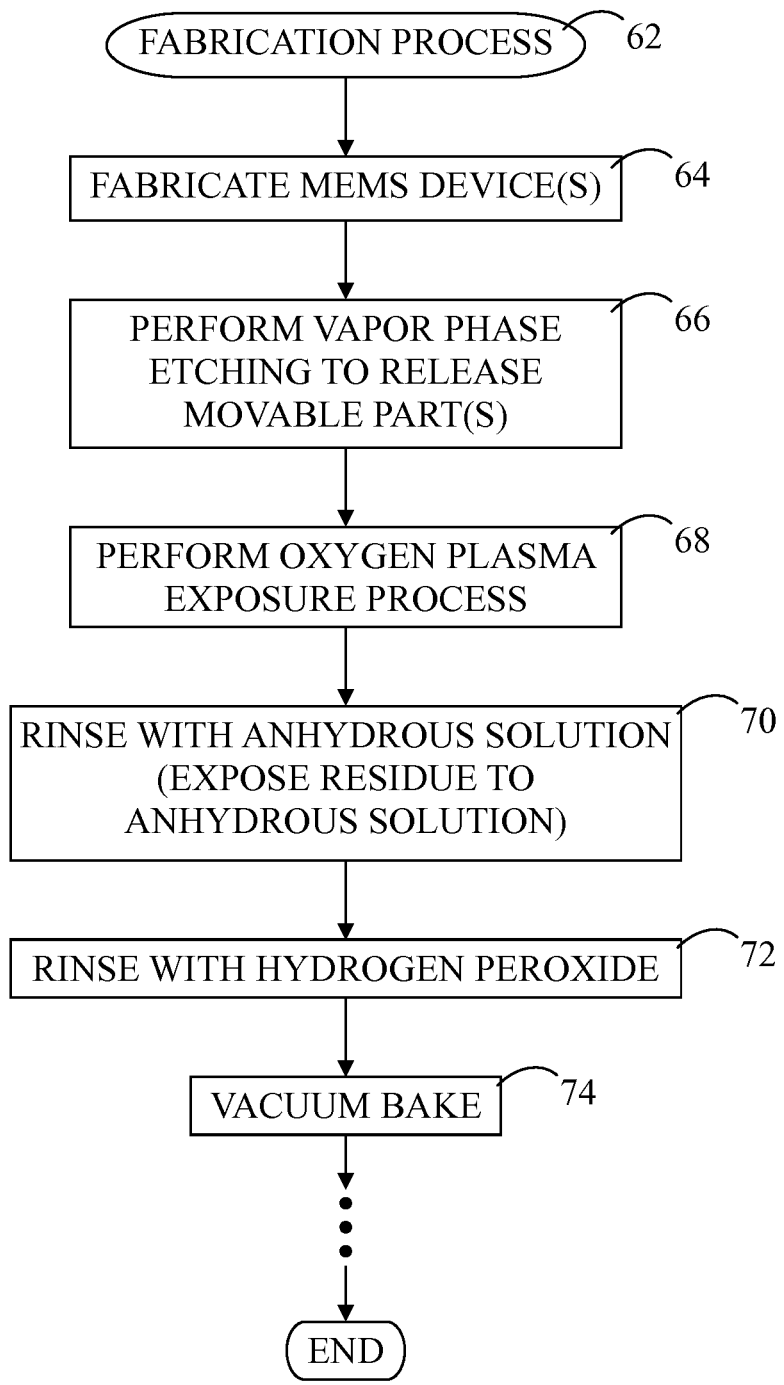
FIG. 6 shows a flowchart of a MEMS device fabrication process in accordance with an embodiment.

FIG. 6 shows a flowchart of a MEMS device fabrication process 62 in accordance with an embodiment. Fabrication process 62 is preferably a wafer level process in which multiple MEMS devices are concurrently being fabricated and processed on wafer 26 (FIG. 1). MEMS device fabrication process 62 entails fabricating (step 64) MEMS devices (such as MEMS device 20 discussed in connection with FIGS. 1 and 2) and performing (step 66) vapor phase etching (VPE) to release the movable parts (discussed in connection with FIG. 3). VPE at step 66 can leave ammonium fluorosilicate residue 52 (FIG. 3) on movable part 44, on stops 46, underlying movable part 44, adhered to metallization features 32, 40, and/or on any other exposed surface.

An oxygen plasma exposure process can be performed (step 68), in an embodiment, to remove some of the volatile ammonium fluorosilicate residue 52. An oxygen plasma exposure process, also referred to as plasma cleaning, involves the removal of impurities and contaminants from surfaces through energetic plasma created from gaseous species. Gases such as oxygen and argon, as well as mixtures such as air and hydrogen/nitrogen can be used. If the gas is oxygen, the plasma is an effective, economical, environmentally safe method for critical cleaning.

An oxygen plasma exposure process can be effective in removing a significant portion, but not necessarily all of ammonium fluorosilicate residue 52. However, there is a significant risk of thermal modification during the oxygen plasma exposure process at step 68 rendering the remaining residue 52 unstrippable during a subsequent cleaning process. Therefore, the oxygen plasma exposure process should be short, for example, on the order of fifteen seconds or less.

In an embodiment, the oxygen plasma exposure process at step 68 may be timed so that it does not remove all of ammonium fluorosilicate residue 52. In accordance with an embodiment, and referring also to FIG. 7 which shows a cross-sectional side view of the MEMS device 20 from FIG. 3 at a subsequent stage 80 of fabrication, MEMS device 20 is rinsed (step 70) with an anhydrous solution 82. That is, the remaining ammonium fluorosilicate residue 52 underlying movable part 44 is exposed to anhydrous solution. Additionally, the remaining ammonium fluorosilicate residue 52 adhered to metallization features 32, 40 and adhered to other surfaces of MEMS device 20 is exposed to anhydrous solution 82.

An anhydrous solution (also referred to as a non-aqueous solution) is one that contains no water. By utilizing anhydrous solution 82 in lieu of an aqueous solution to remove the remaining ammonium fluorosilicate residue 52, the damaging volumetric expansion of residue 52 and the associated sprung die effect can be avoided. Accordingly, fabrication process 62 entails removing residue 52 by exposing it to anhydrous solution 82 at step 70. In addition, fabrication process 62 entails abstaining from exposing residue 52 produced during VPE to an aqueous solution following step 66, as well as prior to and during step 70, so as to avoid any volumetric expansion of residue 52.

In accordance with an embodiment, anhydrous solution 82 may be an anhydrous acetic acid (AcOH), preferably blended with acetic anhydride. For example, the blend may be nominally 60 wt % acetic anhydride and 40 wt % acetic acid in an embodiment. If the cleaning chemistry becomes contaminated with water either from natural exposure to the fabrication environment and/or during processing, the acetic anhydride would react with the water through hydrolysis and be converted to acetic acid. Accordingly, an implementation using the blend of acetic anhydride and acetic acid prevents the product wafers (e.g., wafer 26 in FIG. 1) from being exposed to water that could lead to the expansion of residue 52 and related damage.

Although a blend of 60 wt % acetic anhydride and 40 wt % acetic acid may be used, other formulations can also be capable of delivering acceptable results. However, a lower concentration of acetic anhydride can lower the capacity of the anhydrous blend of acetic anhydride and acetic acid to overcome water contamination effects, and may therefore be less desirable. Similarly, while pure acetic acid (without acetic anhydride) may be effective in removing ammonium fluorosilicate residue 52, it may only be useful in environments where water contamination is not present.

In principal, any anhydrous solution which offers effective ammonium fluorosilicate dissolution at high selectivity to exposed aluminum or copper, silicon, and silicon nitride may be utilized in lieu of the blend of acetic anhydride and acetic acid. Other exemplary anhydrous solutions include, for example, isopropyl alcohol (IPA), acetone, and the like. However, these solutions may be most useful in environments where water contamination is not present since they do not have the attribute of reacting with the water and subsequently consuming it via a hydrolysis reaction. Furthermore, certain anhydrous solutions such as IPA and acetone are flammable, thus requiring specialized fire safety equipment.

In a preferred embodiment, the combination of the oxygen plasma exposure process step 68 followed by the anhydrous solution exposure step 70 ensures largely complete removal of ammonium fluorosilicate residue 52 without collateral damage to the MEMS device structures. Additionally, the short duration oxygen plasma exposure process step 68 reduces the load or amount of ammonium fluorosilicate residue 52 to be removed at the anhydrous solution exposure step 70. In an alternative scenario, if the short duration oxygen plasma exposure process step 68 is not performed and the cleaning chemistry at the anhydrous solution exposure step 70 has some trace of residual water, sprung die can still occur because the anhydrous solution now has to dissolve or otherwise remove the full volume of VPE ammonium fluorosilicate residue 52 with trace water being present in the system.

Fabrication process 62 further entails rinsing (step 72) the MEMS devices with an aqueous solution, such as hydrogen peroxide. Since the ammonium fluorosilicate residue 52 was previously removed at steps 68 and 70, a rinse operation using an aqueous solution, such as hydrogen peroxide, is not likely to result in the sprung die condition. The hydrogen peroxide rinse step 72 is performed to remove any remaining residues and/or to remove titanium nitride mask 34 from the surfaces of metallization features 32, 40 (see FIG. 1).

Figure 7:
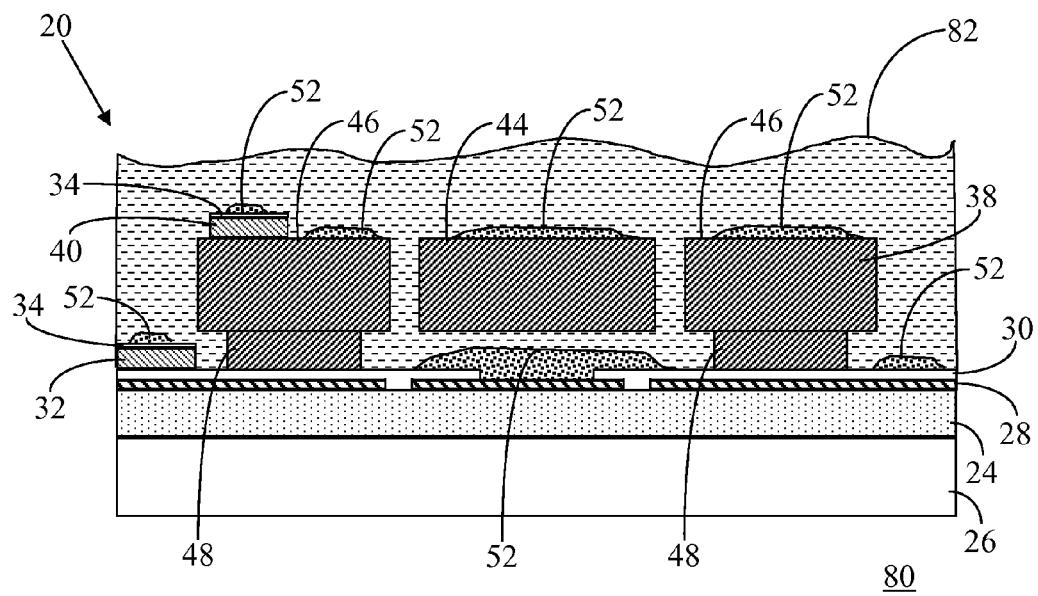
FIG. 7 shows a cross-sectional side view of the MEMS device from FIG. 3 at a subsequent stage of fabrication according to an embodiment.
Figure 8:
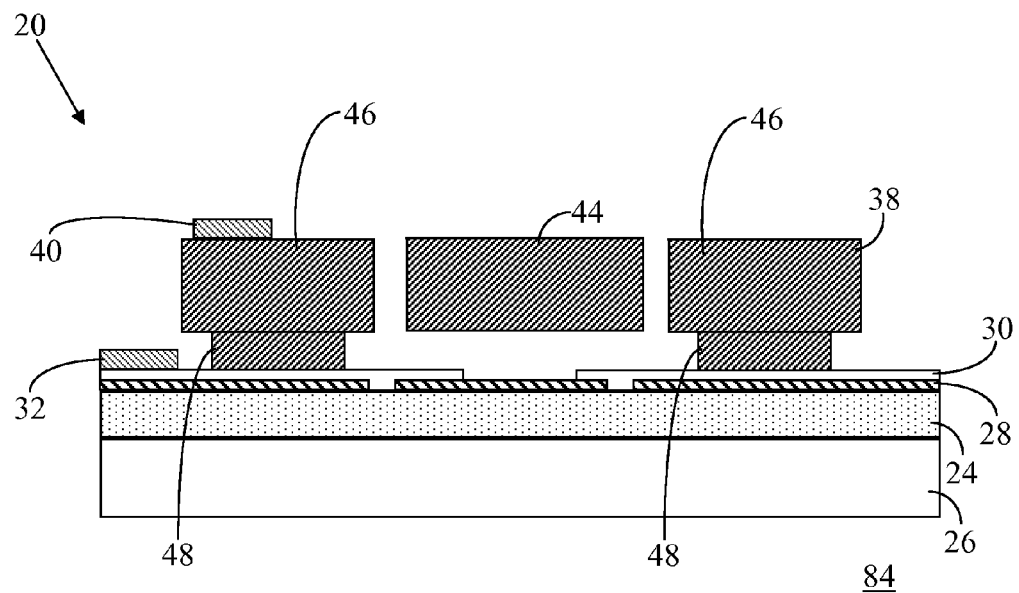
FIG. 8 shows a cross-sectional side view of the MEMS device from FIG. 7 at a subsequent stage of fabrication according to an embodiment.

FIG. 8 shows a cross-sectional side view of the MEMS device 20 from FIG. 7 at a subsequent stage 84 of fabrication following removal of the remaining residues and titanium nitride mask 34. MEMS device 20 may be vacuum baked (step 74) in accordance with known processes to evaporate any other undesirable elements remaining in MEMS device. Thereafter, additional operations represented by ellipses may entail testing, wafer dicing, and so forth after which fabrication process 62 ends.

It is to be understood that certain ones of the process blocks depicted in FIG. 6 may be performed in parallel with each other or with performing other processes. In addition, it is to be understood that the particular ordering of the process blocks depicted in FIG. 6 may be modified, while achieving substantially the same result. Accordingly, such modifications are intended to be included within the scope of the inventive subject matter. In addition, although package configurations are described in conjunction with FIGS. 1-5, 7, and 8 above, embodiments may be implemented in packages having other architectures, as well. These and other variations are intended to be included within the scope of the inventive subject matter.

For simplicity and clarity of illustration, the drawing figures illustrate the general manner of construction. Descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention. Furthermore, different elements may be illustrated variously to include hatching or stippling in order to more clearly distinguish the elements from one another.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below," and the like in the description and the claims, if any, are used for describing relative positions and not necessarily for describing permanent positions in space. It is to be understood that the embodiments of the invention described herein may be used, for example, in other orientations than those illustrated or otherwise described herein.

The term "coupled," as used herein, is defined as directly or indirectly connected in an electrical or non-electrical manner.

An embodiment of a method of making a MEMS device includes etching away a sacrificial material layer to release a mechanical element of the MEMS device. The mechanical element is formed at least partially on the sacrificial material layer, and the etching leaves a residue in proximity to the mechanical element. The residue is exposed to an anhydrous solution to remove the residue. The method entails the implementation of an anhydrous solution during MEMS device fabrication to reliably remove vapor phase etching (VPE) residue without introducing collateral damage to the released structures. Such methodology can significantly increase MEMS device yield and reliability, with reduced risk of sprung die and broken spring structures. Furthermore, the anhydrous solution can reliability remove metal contaminated VPE residue from the metal bond pads to increase wire bond reliability between the bond pads and bonding wires.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method of making a microelectromechanical systems (MEMS) device comprising:
   etching away a sacrificial material layer to release a mechanical element of said MEMS device, said mechanical element being formed at least partially on said sacrificial material layer, wherein said etching comprises performing a vapor phase etch (VPE) process and said etching leaves a residue in proximity to said mechanical element;
   performing an oxygen plasma exposure process to remove a volatile portion of said residue from said MEMS device; and
   following said etching and said performing, exposing said residue to an anhydrous solution to remove said residue.

2. The method of claim 1 wherein said mechanical element comprises a movable part, said residue underlies said movable part and said exposing comprises exposing said MEMS device to said anhydrous solution to remove said residue underlying said movable part.

3. The method of claim 1 wherein said anhydrous solution comprises acetic acid.

4. The method of claim 3 wherein said anhydrous solution further comprises acetic anhydride blended with said acetic acid.

5. The method of claim 1 wherein said anhydrous solution comprises isopropyl alcohol.

6. The method of claim 1 wherein said anhydrous solution comprises acetone.

7. The method of claim 1 further comprising rinsing said MEMS device in hydrogen peroxide following said exposing.

8. The method of claim 1 wherein said MEMS device further comprises metallization features, wherein following said etching, said residue is contaminated with aluminum from said metallization features, and wherein said exposing comprises exposing said metallization features to said anhydrous solution to remove said aluminum contaminated residue from said metallization features.

9. The method of claim 1 wherein said residue comprises a hygroscopic chemical compound that undergoes volumetric expansion when exposed to an aqueous solution, and said method further comprises abstaining from exposing said residue to said aqueous solution prior to said exposing.

10. The method of claim 1 wherein said residue comprises a chemical compound containing nitrogen, hydrogen, silicon, and fluorine.

11. The method of claim 1 wherein said residue comprises ammonium fluorosilicate, $(NH_4)_2SiF_6$.

12. The method of claim 11 wherein said MEMS device comprises metallization features, said metallization features comprising aluminum, and wherein said ammonium fluorosilicate residue is contaminated with said aluminum.

13. A method of making a microelectromechanical systems (MEMS) device comprising:
    etching away a sacrificial material layer to release a mechanical element of said MEMS device by performing a vapor phase etch (VPE) process, said mechanical element being formed at least partially on said sacrificial material layer, wherein said etching leaves a residue in proximity to said mechanical element;
    performing an oxygen plasma exposure process to remove a volatile portion of said residue from said MEMS device;
    following said etching and said performing, exposing said residue to an anhydrous solution to remove said residue; and
    rinsing said MEMS device in hydrogen peroxide following said exposing.

14. The method of claim 13 wherein said residue comprises a hygroscopic chemical compound that undergoes volumetric expansion when exposed to an aqueous solution, and said method further comprises abstaining from exposing said residue to said aqueous solution prior to said exposing.

15. A method of making a microelectromechanical systems (MEMS) device comprising:
    etching away a sacrificial material layer to release a mechanical element of said MEMS device by performing a vapor phase etch (VPE) process, said mechanical element being formed at least partially on said sacrificial material layer, wherein said etching leaves an ammonium fluorosilicate, $(NH_4)_2SiF_6$, residue in proximity to said mechanical element;
    performing an oxygen plasma exposure process to remove a volatile portion of said residue from said MEMS device; and
    following said etching and said performing, exposing said ammonium fluorosilicate residue to an anhydrous solution to remove said ammonium fluorosilicate residue, said anhydrous solution comprising a blend of acetic acid and acetic anhydride.

16. The method of claim 15 wherein said mechanical element comprises a movable part, said ammonium fluorosilicate residue underlies said movable part and said exposing comprises exposing said MEMS device to said anhydrous solution to remove said ammonium fluorosilicate underlying said movable part.

17. The method of claim 15 wherein said MEMS device further comprises metallization features, wherein following said etching, said ammonium fluorosilicate residue is contaminated with aluminum from said metallization features, and wherein said exposing comprises exposing said metallization features to said anhydrous solution to remove said aluminum contaminated ammonium fluorosilicate residue from said metallization features.

* * * * *